United States Patent [19]
Murray

[11] Patent Number: 5,703,769
[45] Date of Patent: Dec. 30, 1997

[54] POWER SWITCH WITH INRUSH CURRENT CONTROL

[75] Inventor: Thomas P. Murray, Queensville, Canada

[73] Assignee: International Business Machines Corporation, Armonk, N.Y.

[21] Appl. No.: 332,963

[22] Filed: Nov. 1, 1994

[30] Foreign Application Priority Data

Nov. 15, 1993 [CA] Canada ................... 2,103,133

[51] Int. Cl.[6] ........................................ H02H 7/10
[52] U.S. Cl. ........................................ 363/50; 323/908
[58] Field of Search ..................... 323/907, 908, 323/285; 363/50; 307/571

[56] References Cited

U.S. PATENT DOCUMENTS

| | | | |
|---|---|---|---|
| 5,010,293 | 4/1991 | Ellersick | 323/278 |
| 5,321,313 | 6/1994 | Oberhauser | 307/242 |
| 5,359,244 | 10/1994 | Hopkins | 307/571 |
| 5,394,076 | 2/1995 | Huykman | 323/222 |
| 5,523,724 | 6/1996 | Assar et al. | 331/1 A |

*Primary Examiner*—Peter S. Wong
*Assistant Examiner*—Rajnikant B. Patel
*Attorney, Agent, or Firm*—Felsman, Bradley, Gunter & Dillon, L.L.P

[57] ABSTRACT

A power control circuit is provided for coupling a load to a power source. It includes a transistor for coupling said load to the power supply through the transistor dependent upon a control voltage applied to a control terminal of the transistor, a charge pump circuit having its output connected to the transistor control terminal to apply a controlled turn on signal to the transistor when the charge pump is activated, wherein the controlled signal gradually increases until the transistor is biased into its fully on state.

23 Claims, 1 Drawing Sheet

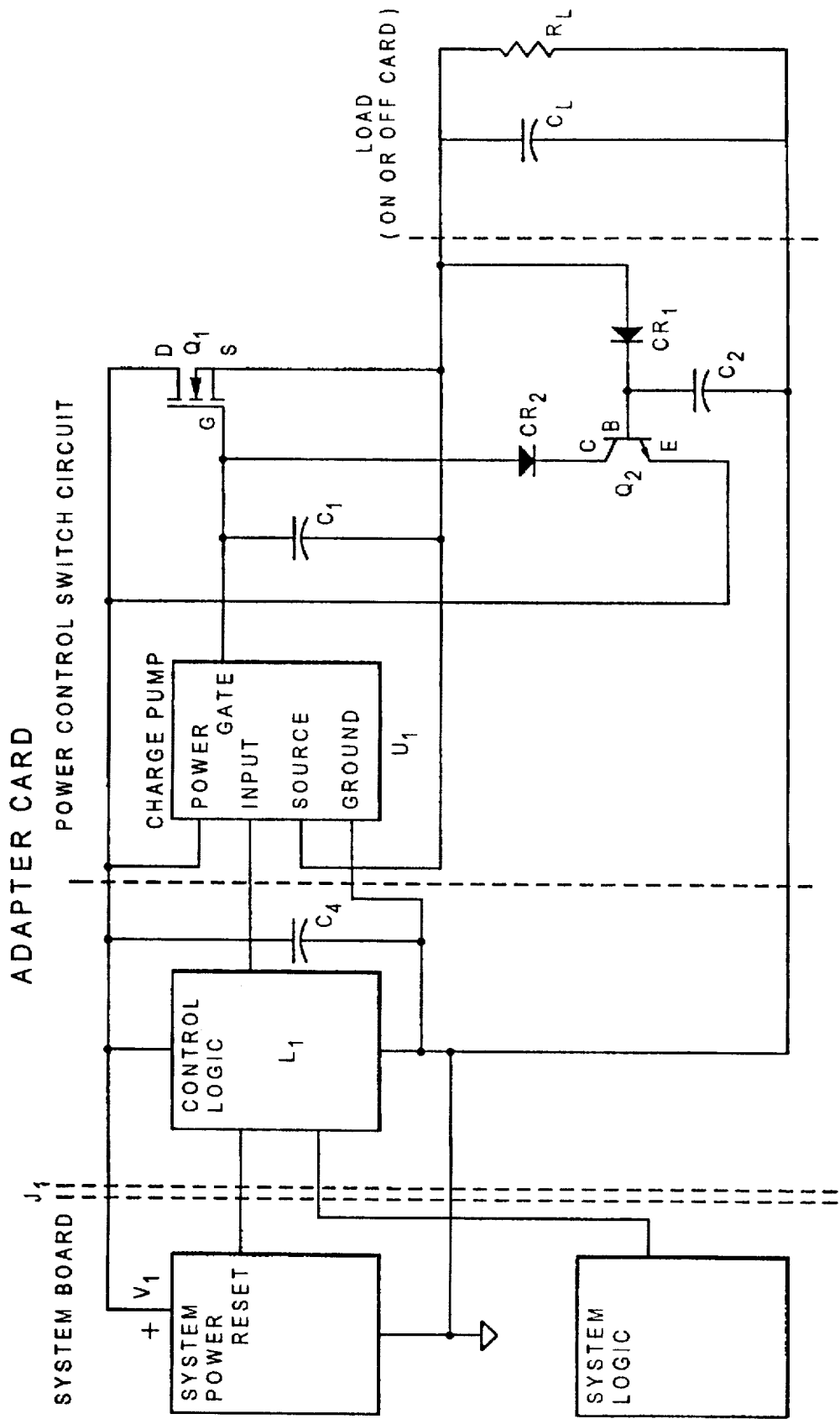

POWER SWITCH WITH INRUSH CURRENT CONTROL

BACKGROUND OF THE INVENTION

1. Technical Field:

The present invention relates to the interconnection of electronic cards to electronic system boards and more particularly to a circuit which controls the power application to the load on an adapter card so as to reduce the disturbance to the system board power supply.

2. Description of the Related Art:

The sudden connection of electronic cards to a powered system board can cause problems due to the surge current demanded by uncharged load capacitance on the cards. This surge current can cause damage to components of the circuit cards and disturb the operation of the system board or other cards connected thereto as power transients are generated as the power supply for the system board tries to compensate for a sudden change in loading.

It is known to use connectors with contacts of different lengths to provide sequential voltage application when a card is inserted into a powered system, with the first to connect having a resistance to limit the surge current. This has been described in U.S. Pat. No. 4,245,270 issued Jan. 13, 1981 and assigned to Rockwell International Corporation. One problem with this arrangement is that under circumstances, such as quick insertion, the shorter, low resistance connection may make contact before the card has been fully charged through the limiting resistor defeating the protection. This would cause an uncontrolled surge of current to flow. Also, there is no control if the power is cycled off and on again with the card already installed as the shorter low resistance connection is in full contact with the power supply without benefit of the protection of the limiting resistor.

Another approach is to use a linear voltage regulation scheme, with a controlled rate of change for the current, such as described in IBM Technical Disclosure Bulletin Vol. 34, No. 4A, September 1991, pp. 9, 10. This approach suffers from power loss in the mode used and from voltage disturbances caused by changes in load current which result from the inherent system response time.

The maximum level of current flow can be limited by circuits such as described by U.S. Pat. No. 5,010,293 issued Apr. 23, 1991 and assigned to Raynet Corporation. However this does not control the sudden flow of current up to the preset limit. This sudden change in current can still cause the system power supply to sense a fault and issue a reset pulse to the system disrupting normal system use.

Another approach is to use an electronic time delay to keep the adaptor card logic disabled until the disturbance caused by the surge current has passed. This is described in JP03-278214 and 3935-527. Holding the card logic disabled prevents it from creating any false signals, but it does not prevent surge current effects still present from causing disruptions to the system board power or to other cards.

The use of a Positive Temperature Coefficient resistor (PTC) to limit inrush current will limit the initial surge of current and as the PTC heats up, the resistance will drop to a low value causing a much lower voltage drop. This is described in U.S. Pat. No. 3,935,511 issued Jan. 27, 1976 and assigned to Texas Instruments Incorporated. The thermal time constant of the PTC prevents it from providing any protection from surge current if the power is removed for a short time and reapplied before the PTC can cool down sufficiently. Also, the remaining resistance in the device is a parasitic load during normal operations which can be undesirable especially where power conservation is important and heat generation must be controlled.

SUMMARY OF THE INVENTION

It is therefore one object of the present invention to prevent disruption of the power to a system to which the circuit card is newly connected while the system is powered.

It is therefore another object of the invention to provide a means of restoring the proper circuit operation after power removal and reapplication.

It yet another object of the invention to provide a power switch which is compact and power conservant as to be useable within the PCMCIA area.

The foregoing objects are acheived as is now described. The invention prevents the sudden surge of current that will flow when a large, low impedance or capacitive load is rapidly connected to a power supply through a low impedance connection. The invention inclues a power control ciruit for coupling a load to a power source, a transistor for coupling the load to the power supply through the transistor, dependant upon a control voltage, a charge pump ciruit with its output connected to the transistor to apply controlled turn-on signal when the charge pump is activated, wherein the controlled signal gradually increases until the transistor is biased into its fully-on state, and a discharge circuit coupled to the transistor to quickly reduce the control voltage to turn off the transisor when power from said power source is interrupted.

The above as well as additional objectives, features, and advantages of the present invention will become apparent in the following detailed written description.

BRIEF DESCRIPTION OF THE DRAWINGS

The invention will be further understood from the description herein and the accompanying drawing.

FIG. 1 is a circuit diagram illustrating a current control power switch in accordance with an embodiment of the invention as applied to a typical load having resistive (RL) and capacitive (CL) characteristics.

DETAILED DESCRIPTION OF PREFERRED EMBODIMENT

The present invention seeks to overcome the limitations of the prior art by providing a circuit which can be advantageously used, for instance, in an accessory circuit card which allows power to be applied to a low impedance or capacitive load in a manner which prevents the disruption of the power to a system to which the circuit card is newly connected while the system is powered.

Another aspect of the invention is to provide a means of restoring proper circuit operation after power removal and reapplication, which could occur either by a temporary power interruption, shut off of the power supply and then on at a later time, or by removal and reattachment of the circuit card to the system board.

Another aspect of this invention is to provide a power switch of the capabilities mentioned above which is sufficiently compact and power conservant as to be useable within the confines of the PCMCIA accessory card size and power constraints to protect the circuitry of the card and any accessories that may be coupled to and powered through the card from the power supply of the system to which the PCMCIA card is connected.

The circuit of the present invention is used to prevent the sudden surge of current that will flow when a large, low impedance or capacitive load is rapidly connected to a power supply through a low impedance connection. Inadvertent removal of power will cause the circuit to reset the power switch in such a manner as to provide protection should the power be quickly reapplied.

According to one aspect of the invention a power control circuit is provided for coupling a load to a power source. It includes a transistor for coupling the load to the power supply through the transistor dependent upon a control voltage applied to a control terminal of the transistor. It also includes a charge pump circuit with its output connected to the transistor control terminal to apply a controlled turn-on signal to the transistor when the charge pump is activated, wherein the controlled signal gradually increases until the transistor is biased into its fully on state. Another aspect of the invention provides, in addition to the above, a discharge circuit coupled to said control terminal of said transistor which quickly reduce the control voltage at said control terminal to turn said transistor off if power from said power source is interrupted.

According to yet another aspect of this invention there is provided a power control circuit for coupling a load to a power source, which includes: a transistor, preferably an N-channel enhancement mode POWER MOSFET, for coupling the load to the power supply. The transistor is controlled by a control voltage applied to the control terminal of the transistor (in the case of a MOSFET, the gate). A charge pump circuit connected to control the MOSFET is adapted to apply a gradually increasing control voltage to the MOSFET to gradually turn the MOSFET on. This will result in gradually increasing current flow through the MOSFET to the load. The charge pump continues to supply an increasing voltage to the MOSFET gate until the voltage is sufficient to bias the MOSFET completely on.

In a preferred embodiment the drain of the MOSFET is directly powered by the positive side of the power supply used by the system. The source of the MOSFET is connected to the load. The other node is grounded to the system power supply. A discharge circuit is provided which is coupled to the gate of the MOSFET and its drain terminal to quickly turn the MOSFET off in event of power removal. This will assist in bringing the power control circuit quickly back to its initial state to allow it to control power application to the load again should power be restored, protecting the load and power supply from potentially destructive power transients.

Referring to FIG. 1, a preferred embodiment of the invention is shown. In this embodiment the power coupling transistor Q1 comprises an N-channel Enhancement Mode Power MOSFET, such as a SILICONIX SI9410DY, the specifications of which are readily available. The gate of Q1 is driven by charge pump U1, such as the MIC 5014, or MIC 5015 charge pumps manufactured by MICREL SEMICONDUCTOR, the charge pump charges gate capacitor C1 to gradually raise the gate voltage Vg to turn on Q1 gradually when charge pump V1 is activated by control logic L1 under system control.

The use of an efficient N-channel MOSFET power switch device Q1 provides for minimal power loss during normal operation. Placing the switch Q1 between the load and the power supply allows the load to remain at ground potential when not in operation, but dictates that some method to supply voltage to the gate of the MOSFET power switch Q1, at a level of 10 to 15 volts above the power supply voltage, should be provided to ensure proper operation under varying voltage or loading conditions. Charge pump circuit U1 is used to supply this voltage level. Due to the nature of the MOSFET circuitry, should the supply voltage be removed with the switch left in the "on" condition, the power MOSFET Q1 would remain in the conductive state for a considerable length of time rendering the load and power system vulnerable to the problems noted previously. To prevent this a discharge circuit comprised of a small NPN bipolar transistor Q2, such as 2N2222, a small storage capacitor C2, e.g. 0.1 uF, and two blocking diodes CR1, CR2 are incorporated. The transistor Q2 is used to quickly drain the charge off the gate of the MOSFET Q1 if the supply voltage V1 drops.

In this embodiment, the power switch Q1 is on the positive side of the load, which allows the load to be at ground potential when not activated. While noted here as being undesirable in the present instance, normal practice of using a N-channel MOSFET would be to switch the power MOSFET on or off as fast as possible in order to reduce the power dissipated in the MOSFET. In order to do this some electronic circuits use charge pumps to build up and maintain voltage in a storage capacitor which is then connected by high speed transistors to the gate of the power MOSFET. In loads powered by the MOSFET where the loads include significant uncharged capacitive components, this fast turn on of the power MOSFET will result in a large surge of current from the power supply into the load.

By using a small capacity charge pump U1, operating directly into the gate of the MOSFET and adding (external) capacitance C1 between the gate G and the source S of the MOSFET, a gradual, controlled turn on of the MOSFET is achieved. During this turn on time, the MOSFET switch acts as an increasing current source to the load until the load voltage VL is equal to the power supply voltage V1. Careful selection of component values will give a reliable, gradual turn on. We have found that a turn on time of 200 to 300 milliseconds is sufficiently gradual for system boards and PCMCIA accessories that we have been studying. Once the charge pump has raised the gate voltage V2 to the required value, approximately 10–15 volts, it automatically enters a standby mode to maintain the charge on the gate G.

When control logic commands, eg. under program control, the charge pump switches the MOSFET off, the charge pump is stopped and an internal drain transistor in the charge pump is energized to remove the charge on the MOSFET gate. If the source power V1 is interrupted with the MOSFET in the "on" state, the charge pump circuit's internal drain time is unable to remove the charge on the MOSFET gate and the very low current leakage rate of the components will allow the MOSFET to remain in the "on" state for several minutes. Should the source power be reapplied during this time, a large surge current could flow. To prevent this, the preferred embodiment of the invention shown employs a drain circuit comprising NPN transistor Q2 with its emitter coupled to the drain D of Q1 and its collector coupled to gate S of Q1 through diode CR2. The base of Q2 is coupled to the positive side of the load through diode CR1. Capacitor C2 stores energy for Q2 to discharge the gate G in case of power interruption.

When the MOSFET Q1 is switched on, allowing current to flow into the load, a small amount of current flows through blocking diode CR1 to charge the capacitor C2. This capacitor will charge up to a voltage that is one diode drop below the power supply voltage V1. With the emitter of transistor Q2 connected to the power supply, the base-emitter junction is reverse biased and therefore transistor Q2 will remain turned off. The second blocking diode CR2 prevents current from the capacitor C2 or from the load capacitance CL, from flowing into the charge pump circuit during a normal turn off.

Should the system power be removed, the control logic will quickly drain the charge off the decoupling capacitor C4 and the load RL will quickly drain the charge off load capacitance CL. The blocking diode CR1 prevents the capacitor C2 from discharging into the load R1. The supply voltage at the emitter of transistor Q2 will now be less than the voltage on capacitor C2 so transistor Q2's base-emitter junction is now forward biased turning transistor Q2 on. Transistor Q2 will discharge the MOSFET Q1 gate G as well as capacitor C1 through blocking diode CR2, and the MOSFET will be quickly turned off. Once the capacitor C2 is discharged, transistor Q2 will turn off and the circuit will be ready for normal operation again.

Although a particular embodiment of the invention has been described in detail it should be appreciated that variations and adaptations may be made without departing from the scope of the invention as defined in the claims. For instance although particular discharge circuitry and an N channel MOSFET is specified in the embodiment of FIG. 1, other types of discharge circuitry or power control transistors may be substituted.

While the invention has been particularly shown and described with reference to a preferred embodiment, it will be understood by those skilled in the art that various changes in form and detail may be made therein without departing from the spirit and scope of the invention.

What is claimed is:

1. A power control circuit for coupling a load to a power source, comprising:

a transistor for coupling said load to said power source through said transistor dependent upon a control voltage applied to a control terminal of said transistor;

a charge pump circuit having its output connected to said transistor control terminal to apply a controlled turn on signal to said transistor when said charge pump is activated;

wherein said controlled signal gradually increases until said transistor is biased into its fully on state; and a capacitor connected to the output of said charge pump to be charged, thereby the capacitance of said capacitor being selected to control the rate of voltage increase of said control signal provided to said transistor input terminal to a rate suitable to control the rate of increase of inrush current to said load.

2. The power control circuit of claim 1 in which said charge pump is connected to cooperate with said transistor to apply a ramp voltage to the control terminal of said transistor to gradually start and increase current applied to said load from said power source, in which the rise time of said ramp voltage is selected to control current inrush to said load to avoid damage to said load or disruption of operation of said power source.

3. The power control circuit of claim 1 in which a capacitor is connected to the output of said charge pump to be charged thereby;

the output of the charge pump and the capacitance of said capacitor being selected to regulate the rate of voltage increase of said control signal provided to said transistor input terminal to a rate suitable to control the increase of inrush current to said load to an appropriate rate.

4. The power control circuit of claim 1 further comprising: a circuit card having low capacitive circuitry and including said power control circuit.

5. The power control circuit of claim 1 further comprising: a circuit card adapted to supply electrical power controlled by said power control circuit to a load that may be coupled to said card; said electrical power being suppliable by the power supply of a system to which said circuit card may be connected.

6. A power control circuit for coupling a load to a power source comprising:

a transistor for coupling said load to said power supply through said transistor dependent upon a control voltage applied to a first terminal of said transistor, wherein said first terminal is a control terminal;

a charge pump circuit having its output connected to said first terminal of said transistor to apply a controlled turn on signal to said transistor when said charge pump is activated;

wherein said controlled signal gradually increases until said transistor is biased into its fully on state; and a discharge circuit coupled to said first and a second terminal of said transistor for quickly reducing the control voltage at said first terminal to turn said transistor off if power from said power source is interrupted.

7. The power control circuit of claim 6 in which said discharge circuit is adapted to quickly switch off said transistor in the event of loss of power from said power source.

8. The power control circuit of claim 6 further comprising: a circuit card having low capacitive circuitry and including said power control circuit.

9. The power control circuit of claim 6 further comprising:

a circuit card adapted to supply electrical power controlled by said power control circuit to a load that may be coupled to said card; said electrical power being suppliable by the power supply of a system to which said circuit card may be connected.

10. A power control circuit for coupling a load to a power source comprising:

a MOSFET transistor for coupling said load to said power supply through said transistor via its power terminals dependent upon a control voltage applied to the gate of said transistor;

a charge pump circuit having its output connected to said gate to apply a controlled turn on signal to said transistor when said charge pump is activated;

wherein said controlled signal gradually increases until said transistor is biased into its fully on state;

a discharge circuit coupled to said gate of said transistor for quickly reducing the control voltage at said gate to turn said transistor off if power from said power source is interrupted.

11. The power control circuit of claim 10 in which a capacitor is connected to the output of said charge pump to be charged thereby;

the capacitance of said capacitor being selected to control the rate of voltage increase of said control signal voltage at the gate of said transistor to a rate suitable to control the rate of turn on of said transistor to control the increase of inrush current to said load.

12. The power control circuit of claim 10 in which a capacitor is connected to the output of said charge pump to be charged thereby;

the output of said charge pump and the capacitance of said capacitor being selected to regulate the rate of voltage increase of said control signal voltage at said transistor gate to a rate suitable to control the rate of increase of inrush current to said load to an appropriate rate.

13. The power control circuit of claim 12 further comprising: a circuit card comprising low capacitive circuitry and including said power control circuit.

14. The power control circuit of claim 13 further comprising:

a circuit card adapted to supply electrical power controlled by said power control circuit to a load that may be coupled to said card; said electrical power being suppliable by the power supply of a system to which said circuit card may be connected.

15. A power control circuit for coupling a load to a power source, comprising:

a transistor coupled between a load and a power source;

a charge pump circuit having its output connected to a control terminal of said transistor; and a capacitor coupled to said charge pump to control a rate of voltage increase at said control terminal of said transistor to control a rate of turn on of said transistor to control a rate of increase of inrush current.

16. The power control circuit in claim 15 wherein said transistor is a MOSFET transistor.

17. The power control circuit in claim 16 further comprising a discharge circuit coupled to the control terminal of said transistor, wherein said discharge circuit is selected with an appropriate ramp voltage to control current inrush to said load.

18. The power control circuit in claim 17 wherein said discharge circuit comprising:

a transistor, the emitter coupled to drain of said MOSFET;

a capacitor coupled to the base of said MOSFET and said load;

two diodes, first and second, said diode first coupled to the gate of said MOSFET and control of said transistor; said diode second coupled to base of said transistor and said load.

19. A power control circuit for coupling a load to a power source comprising:

a N-channel MOSFET transistor for coupling said load to said power supply through said transistor via its power terminals dependent upon a control voltage applied to a gate of said transistor, said transistor being connectable between said power source and said load, a drain of said transistor being connectable to said power source, and the source of said transistor being connectable to one node of said load, the other node of said load being grounded in reference to said power supply when connected to said power control circuit;

a charge pump circuit having its output connected to said gate to apply a controlled turn on signal to said transistor when said charge pump is activated;

wherein said controlled signal gradually increases until said transistor is biased into its fully on state;

a discharge circuit coupled to said gate of said transistor for quickly reducing the control voltage at said gate to turn said transistor off if power from said power source is interrupted, said discharge circuit comprising:

an NPN discharge transistor having its emitter coupled to said drain of said power coupling transistor and its collector coupled to said gate of said power control transistor;

the base of said NPN transistor being coupled to the non-grounded node of said load; and a base capacitor connected between said base of said NPN transistor and ground to provide activation energy for said NPN transistor in event of power failure to turn said NPN transistor on and discharge the voltage present between said gate and drain terminals of said power coupling transistor turning it off;

blocking diodes being provided between the base connected terminal of said base capacitor and said load, and between said gate of said power control transistor and said collector of said NPN transistor to prevent undesirable current flow in aid NPN transistor.

20. The power control circuit of claim 19 in which a capacitor is connected to the output of said charge pump to be charged thereby;

the capacitance of said capacitor being selected to control the rate of voltage increase of said control signal voltage at the gate of said transistor to a rate suitable to control the rate of turn on of said transistor to control the increase of inrush current to said load.

21. The power control circuit of claim 19 in which a capacitor is connected to the output of said charge pump to be charged thereby;

the output of said charge pump and the capacitance of said capacitor being selected to regulate the rate of voltage increase of said control signal voltage at said transistor gate to a rate suitable to control the rate of increase of inrush current to said load to an appropriate rate.

22. The power control circuit of claim 21 further comprising a circuit card comprising low capacitive circuitry and including a power control circuit.

23. The power control circuit of claim 21 further comprising a circuit card adapted to supply electrical power controlled by said power control circuit to a load that may be coupled to said card, said electrical power being suppliable by the power supply of a system to which said circuit card may be connected.

* * * * *